(12) United States Patent
Li et al.

(10) Patent No.: US 9,748,439 B2
(45) Date of Patent: Aug. 29, 2017

(54) ACTIVE MATRIX LIGHT EMITTING DIODES DISPLAY MODULE WITH CARBON NANOTUBES CONTROL CIRCUITS AND METHODS OF FABRICATION

(71) Applicant: ATOM NANOELECTRONICS, INC., Inglewood, CA (US)

(72) Inventors: Huaping Li, Los Angeles, CA (US); Hongyu Liu, El Segundo, CA (US)

(73) Assignee: ATOM NANOELECTRONICS, INC., Inglewood, CA (US)

( * ) Notice: Subject to any disclaimer, the term of this patent is extended or adjusted under 35 U.S.C. 154(b) by 0 days.

(21) Appl. No.: 15/169,375

(22) Filed: May 31, 2016

(65) Prior Publication Data

US 2016/0329378 A1 Nov. 10, 2016

Related U.S. Application Data

(62) Division of application No. 14/577,157, filed on Dec. 19, 2014, now Pat. No. 9,379,166.

(51) Int. Cl.
| | |
|---|---|
| *H01L 21/00* | (2006.01) |
| *H01L 33/06* | (2010.01) |
| *H01L 27/15* | (2006.01) |
| *H01L 27/28* | (2006.01) |
| *H01L 33/00* | (2010.01) |
| *H01L 33/32* | (2010.01) |
| *H01L 33/38* | (2010.01) |
| *H01L 51/05* | (2006.01) |
| *H01L 51/00* | (2006.01) |

(52) U.S. Cl.
CPC ............ *H01L 33/06* (2013.01); *H01L 27/156* (2013.01); *H01L 27/283* (2013.01); *H01L 33/0012* (2013.01); *H01L 33/32* (2013.01); *H01L 33/38* (2013.01); *H01L 51/0005* (2013.01); *H01L 51/0566* (2013.01); *H01L 51/0048* (2013.01); *H01L 51/0558* (2013.01); *H01L 2251/301* (2013.01)

(58) Field of Classification Search
CPC .................................................. H01L 27/3274
USPC ........................................................ 438/105
See application file for complete search history.

(56) References Cited

U.S. PATENT DOCUMENTS

| | | | | |
|---|---|---|---|---|
| 6,890,780 B2 * | 5/2005 | Lee | ...................... | H01L 51/0048 438/23 |
| 7,786,466 B2 * | 8/2010 | Appenzeller | ....... | H01L 27/1104 257/14 |
| 9,214,644 B2 * | 12/2015 | Rinzler | ................. | H01L 51/057 |

* cited by examiner

Primary Examiner — Chandra Chaudhari
(74) Attorney, Agent, or Firm — Polsinelli PC

(57) ABSTRACT

An active matrix light emitting diodes display module integrated with single-walled carbon nanotubes control circuits includes a light emitting diode pixel having a crystalline semiconductor light emitting diode, single-walled carbon nanotubes switching transistors and a charge storage capacitor.

20 Claims, 15 Drawing Sheets

V=2.5 V

V=2.7 V

V=3.0 V

V=3.5 V

US 9,748,439 B2

ACTIVE MATRIX LIGHT EMITTING DIODES DISPLAY MODULE WITH CARBON NANOTUBES CONTROL CIRCUITS AND METHODS OF FABRICATION

This application is a divisional application of U.S. application Ser. No. 14/577,157 filed Dec. 19, 2014, which claims the benefit of U.S. provisional patent application No. 62/074,750 filed on Nov. 4, 2014, all of which are hereby incorporated by reference in their entireties.

BACKGROUND OF THE INVENTION

Field of the Invention

Embodiments of the invention relate to the structure and fabrication of a control circuit, and more particularly, to a carbon nanotubes control circuit. Although the embodiments of the invention are suitable for a wide scope of applications, it is particularly suitable for a carbon nanotubes control circuit of a pixel in an active matrix light emitting diodes display module.

Discussion of the Related Art

Active matrix display panels provide high resolution, good image quality, wide color gamut and fast response time with less power consumption. Thus, the Active Matrix Liquid Crystal Display (AMLCD) dominates both current mobile-sized and large-sized display panel markets. However, since Liquid Crystal Display (LCD) is non-emissive, a back light is required that is consistently on when the display is in working status. Because the back light is consistently on, false off-state pixels can more readily occur. Most importantly, the light from the back light needs to pass through multiple layers that contain thin film transistors (TFTs), LCD, polarizers, and color filters to be visible. These layers can block about 95% of the back light and interfere with readability of a display under the sunlight.

To circumvent these deficiencies, an array of emissive organic light emitting diodes (OLEDs) is used, instead of an LCD with a back light, to make an AMOLED display panel. However, due to the inherent instability of organic materials, the lifetime, brightness and working circumstances of AMOLED display panels is limited. In contrast, light emitting diodes made of inorganic crystalline semiconductors, such as gallium nitrides, are known to have a lifetime greater than 100,000 hours and efficiency of >300 lm/Watts. Furthermore, the physical properties of inorganic crystalline semiconductors can withstand harsh environmental conditions, such as elevated temperatures and high pressures.

LED based displays have been widely reported and patented. For example, U.S. Pat. No. 5,789,766 describes a monolithic and passively addressable LED display with amorphous silicon driver circuits. Several other patents, such as, U.S. Pat. Nos. 8,058,663 and 8,642,363, disclose monolithic full-colored active matrix LED ("AMLED") micro-displays using flip-chip technologies.

Both passive matrix and active matrix LEDs can be implemented with thin film transistors in the control circuits. The fabrication of control circuits for LED pixels is typically implemented with amorphous silicon (a-Si) thin film transistors or poly-silicon thin film transistors on the emissive side. However, due to the low field effect mobilities of a-Si TFTs, providing sufficient current to the drive the LED pixels is problematic.

SUMMARY OF THE INVENTION

Accordingly, embodiments of the invention is directed to a solid state power source with frames for attachment to an electronic circuit that substantially obviates one or more of the problems due to limitations and disadvantages of the related art.

An object of embodiments of the invention is to provide active matrix LED display modules with pixels controlled by single-walled carbon nanotubes transistor (SWCNT) circuits that have light emitting diode pixels made of crystalline semiconductors with individual N and P electrodes, single-walled carbon nanotubes switching transistors (Ts); single-walled carbon nanotubes driving transistors (Td); and charge storage capacitors (Cs).

Another object of embodiments of the invention is to provide active matrix LED display modules with pixels in which N-electrode of the LED pixel is electrically coupled to N-common source; gate electrodes of switching transistors (Ts) are electrically coupled to scanning lines; source electrodes of Ts are electrically coupled to data lines; drain electrodes of Ts are electrically coupled to gate electrodes of Td; source electrodes of Td are electrically coupled to Vdd lines; drain electrodes of Td are electrically coupled to P electrodes of LED pixels; dielectrics sandwiched between source electrodes of Td and gate electrodes of Td are charge storage capacitors.

In another object of embodiments of the invention, a method to form active matrix single-walled carbon nanotubes control circuits integrated on LED pixels includes: forming a common source layer for connection to N-electrodes of each pixel form on an LED wafer; forming an insulation layer over the common source; forming a single-walled carbon nanotubes thin film on the insulation layer; forming SD marks on the single-walled carbon nanotubes thin film; patterning an active single-walled carbon nanotubes thin film; forming a source/drain layer over the active single-walled carbon nanotubes thin film; forming a dielectric layer over the SD layer; patterning Via holes in the dielectric layer; and forming a gate layer and a Via contact in the dielectric layer.

Additional features and advantages of embodiments of the invention will be set forth in the description which follows, and in part will be apparent from the description, or may be learned by practice of embodiments of the invention. The objectives and other advantages of the embodiments of the invention will be realized and attained by the structure particularly pointed out in the written description and claims hereof as well as the appended drawings.

To achieve these and other advantages and in accordance with the purpose of embodiments of the invention, as embodied and broadly described, an active matrix light emitting diodes (AMLED) display module integrated with single-walled carbon nanotubes (SWCNT) control circuits having light-emitting diode pixels, wherein each of the light emitting diode pixels includes: a stack of crystalline semiconductor layers with N and P electrodes; a single-walled carbon nanotubes switching transistor; a single-walled carbon nanotubes driving transistor; and a charge storage capacitor.

In another aspect, a method of forming active matrix single-walled carbon nanotubes control circuits integrated on light-emitting diode pixels includes the steps of forming an N-COM layer on an light-emitting diode wafer; forming an insulation layer over the N-COM layer; forming a single-walled carbon nanotubes thin film on the insulation layer; forming a plurality of source and drain contacts on the single-walled carbon nanotubes thin film; patterning an active single-walled carbon nanotubes thin film; forming source and drain electrodes over the active single-walled carbon nanotubes thin film; forming a dielectric layer over the source/drain layer; patterning a plurality of Via holes in the dielectric layer; and forming a gate layer and a Via electrode over the dielectric layer.

In yet another aspect, an active matrix light emitting diode display module includes: light emitting diode pixels; and single-walled carbon nanotubes control circuits connected to the light emitting diode pixels, wherein application of a voltage greater than 2.5 V to the light emitting diode pixels results in light emission.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DESCRIPTION Of THE INVENTION

Figure 1:
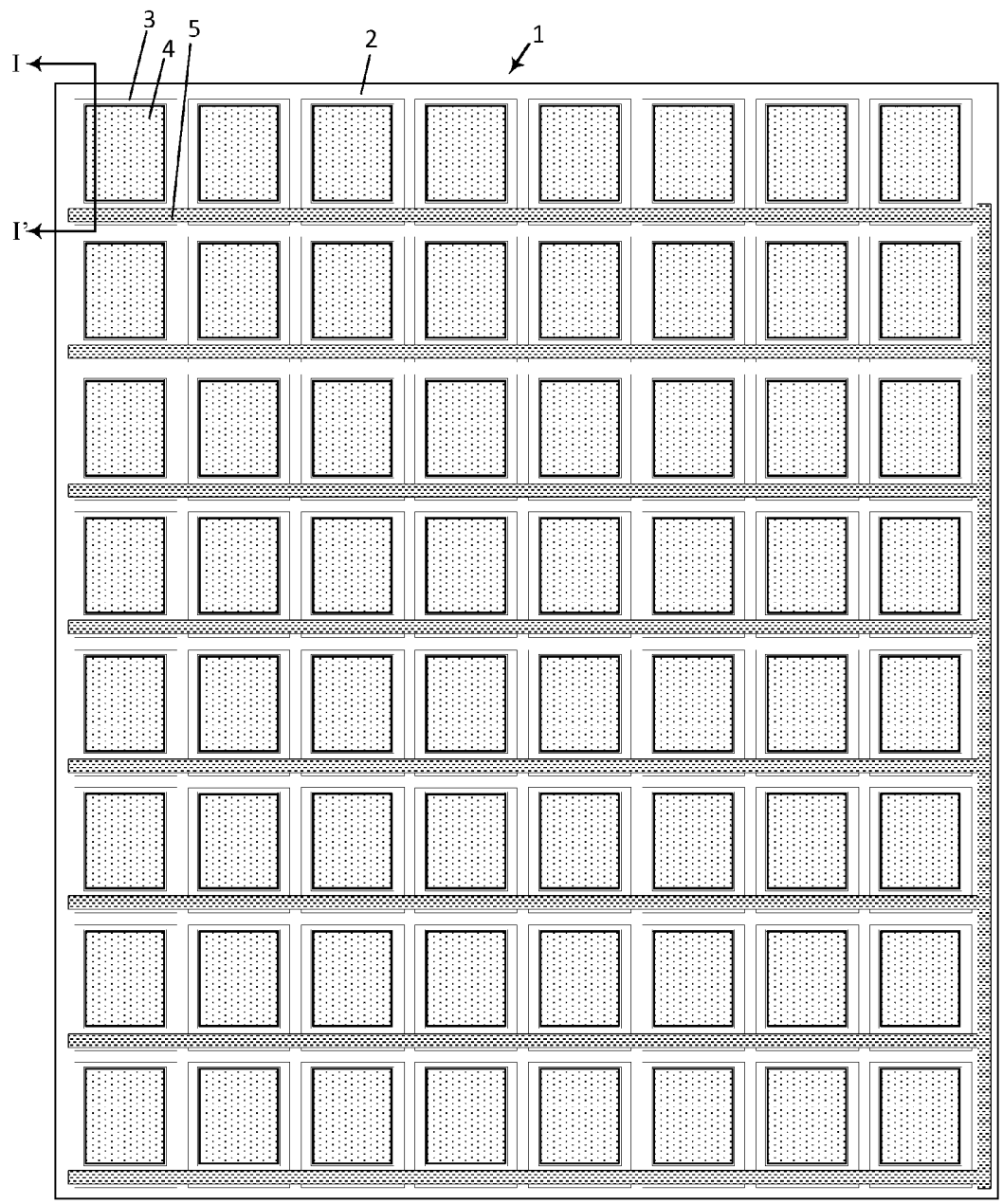
FIG. 1 is an illustration of the layout of LED pixels on a diced LED wafer in which each LED of a pixel is contacted with P and N electrodes.

Reference will now be made in detail to the preferred embodiments of the invention, examples of which are illustrated in the accompanying drawings. Reference will now be made in detail to the preferred embodiments of the invention, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements.

FIG. 1 is an illustration of the layout of LED pixels on a diced LED wafer in which each LED of a pixel is contacted with P and N electrodes. As shown in FIG. 1, a commercially available 2-inch circle wafer of material upon which semiconductor material can be grown or deposited, such as sapphire, is diced into a light emitting module 1. The diced LED wafer 2 includes an array of individual LED pixels 3. The LED of each LED pixel 3 is a stack of crystalline semiconductor layers that form one of a PN LED, a PIN LED or P/QW/N LED. A P electrode 4 is positioned in each of the LED pixels 3. An N electrode 5, which is separate from the P electrode 4, positioned in each of the LED pixels 3. As shown in FIG. 1, all of the N electrodes 5 of the LED pixels are commonly connected in the light emitting module 1 and the P electrodes 4 are individual electrodes for the LED pixels 3, respectively.

Figure 2:
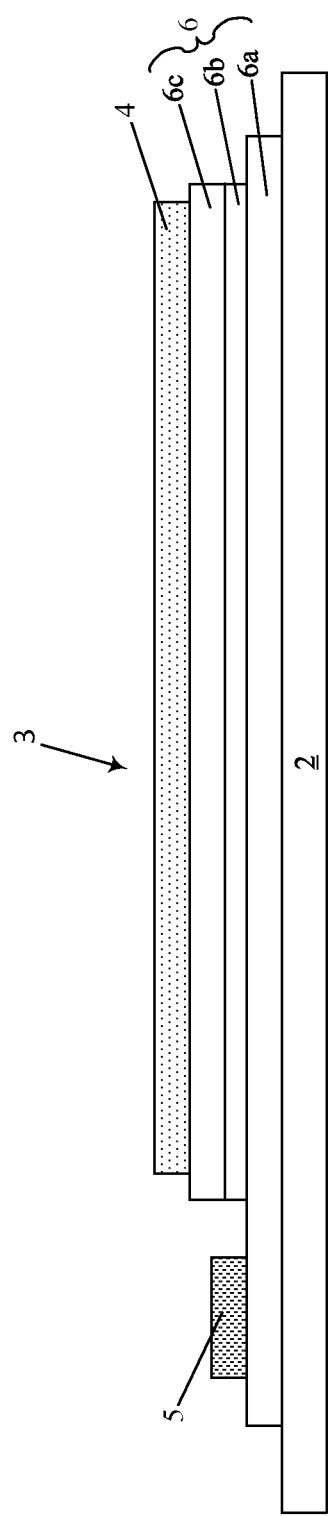
FIG. 2 is a cross-sectional view along line I-I of a single LED pixel according to embodiments of the invention.

FIG. 2 is a cross-sectional view along line I-I of a single LED pixel according to embodiments of the invention. As shown in FIG. 2, an LED 6 of an LED pixel 3 is a stack of semiconductor layers 6a, 6b and 6c. In embodiments of the invention, the crystalline semiconductor layers of the light-emitting diodes (LEDs) can be gallium nitride. For example, the first layer 6a can be an N-GaN, the second layer 6b can be a quantum well layer or intrinsic layer and the third layer 6c can be a P-GaN layer. The structure of the substrate 2 and the LED 6 can have an overall height of about 80 μm. At the top of the LED 6 or on the third layer 6c, a P-electrode 4 is positioned. On the first layer 6a of the LED 6, an N-electrode 5 is disposed away from the second layer 6b and the third layer 6c. The P-electrode 4 and the N-electrode 5 can be commonly referred to as pixel electrodes.

Figure 3:
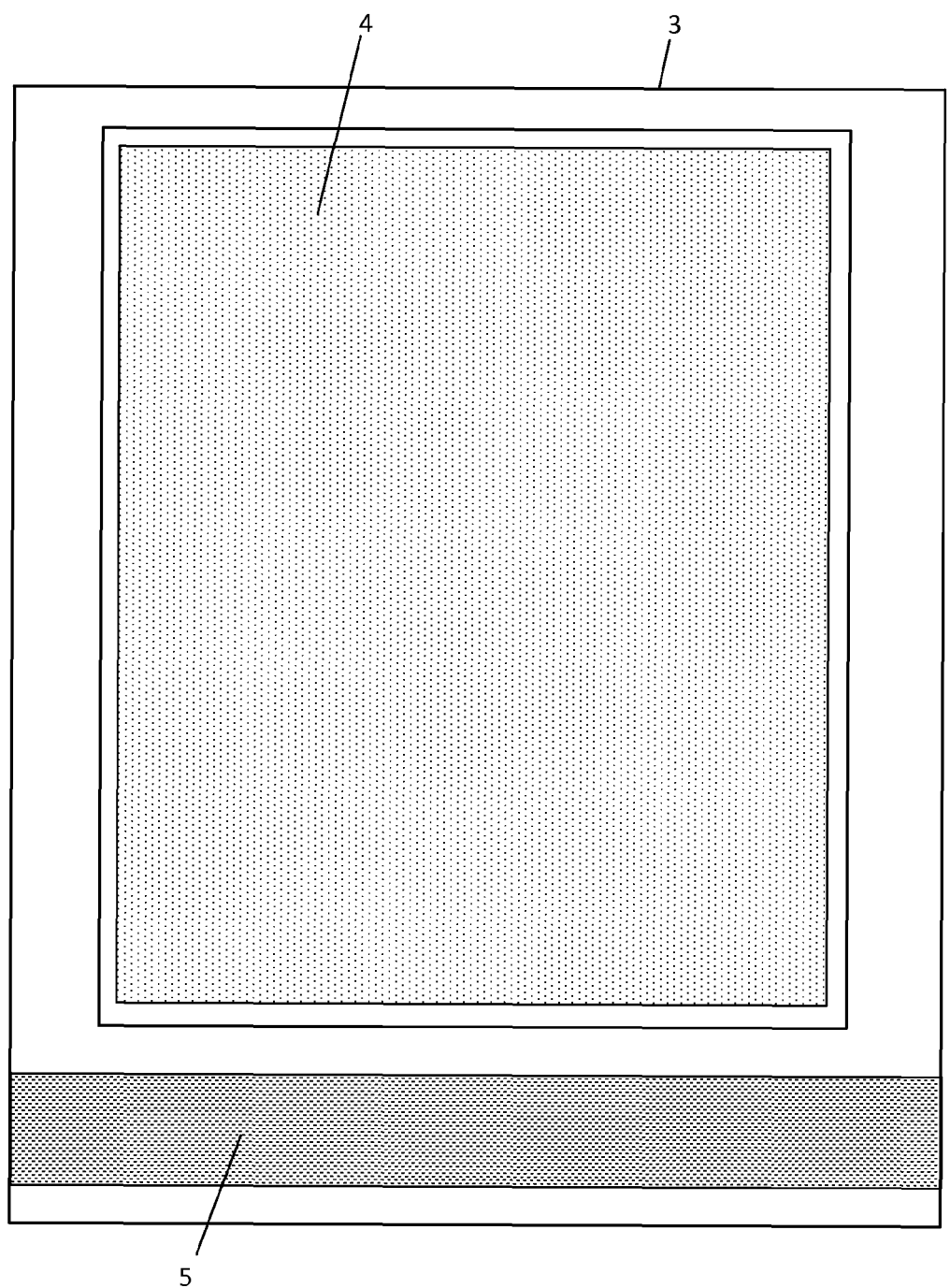
FIG. 3 is a schematic of the top view of single LED pixel according to embodiments of the invention.

FIG. 3 is a schematic of the top view of single LED pixel according to embodiments of the invention. As shown in FIG. 3, the individual pixel LED 3 is rectangular and includes a rectangular P-electrode 4 that covers most of the LED 6. In the alternative, the P-electrode 4 can be in the shape of a circle having diameter of about 80 μm. As also shown in FIG. 3, the N-electrode 3 can be a rectangular shape on the first layer 6a of the LED 6. In the alternative, the N-electrode 3 can be in the shape of a quarter of circle with a diameter of about 160 μm.

Figure 4A:
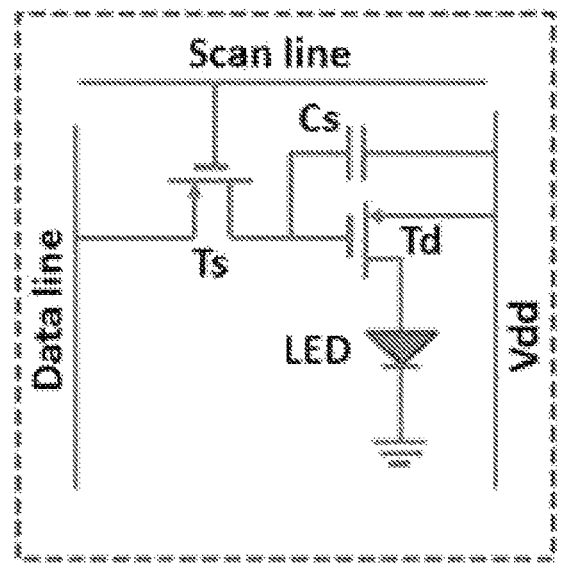
FIG. 4A shows a schematic diagram of SWCNT control circuits according to embodiments of the invention.

FIG. 4A shows a schematic diagram of Single-Walled Carbon Nanotubes (SWCNT) control circuits according to embodiments of the invention. As shown in FIG. 4A, the drain electrode of the single-walled carbon nanotubes switching transistor Ts directly connects to the gate electrode of a single-walled carbon nanotubes driving transistor Td, the drain electrode of the single-walled carbon nanotubes driving transistor Td directly connects to the P-electrode of LED diode, and the dielectrics sandwiched between the gate electrode of the single-walled carbon nanotubes driving transistor Td, a dielectric sandwiched between the source electrode of the single-walled carbon nanotubes switching transistor Td and the gate electrode of the of single-walled carbon nanotubes driving transistor Td forms a charge storage capacitor. The overall structural design of active matrix LED (AMLED) display module controlled by single-walled carbon nanotubes circuits includes light emitting diode pixels made of crystalline semiconductors with individual N and P electrodes, single-walled carbon nanotubes switching transistors Ts single-walled carbon nanotubes driving transistors Td; and charge storage capacitors Cs. Further, in some embodiments of the invention, the N-electrode of the LED pixel is directly coupled to N-common source with other LED pixels; gate electrodes of the single-walled carbon nanotubes switching transistor Ts are electrically coupled to a scanning line; source electrodes of the single-walled carbon nanotubes switching transistor Ts are electrically coupled to data lines; source electrodes of the single-walled carbon nanotubes driving transistor Td are electrically coupled to Vdd lines; drain electrodes of the single-walled carbon nanotubes driving transistors Td are electrically coupled to P electrodes of LED pixels; dielectrics sandwiched between source electrodes of the single-walled carbon nanotubes driving transistors Td together with the VDD line and the gate electrodes of the single-walled carbon nanotubes driving transistors Td form a charge storage capacitor in parallel to the single-walled carbon nanotubes driving transistor Td.

The single-walled carbon nanotubes transistor (SWCNT) control circuits can be manufactured with a solution process at low temperature to avoid damaging the LEDs. Fabricated single-walled carbon nanotubes transistors are excellent for use as driving circuits for AMLED displays since SWCNTs provide a field effect mobility greater than 180 cm2/Vs, and ON/OFF ratio of greater than $10^6$. Thus, an AMLED with SWCNT control circuits can be bright and have lower power consumption so as to be displays that enable indoor and outdoor augmented reality for both civil and military applications.

Figure 4B:
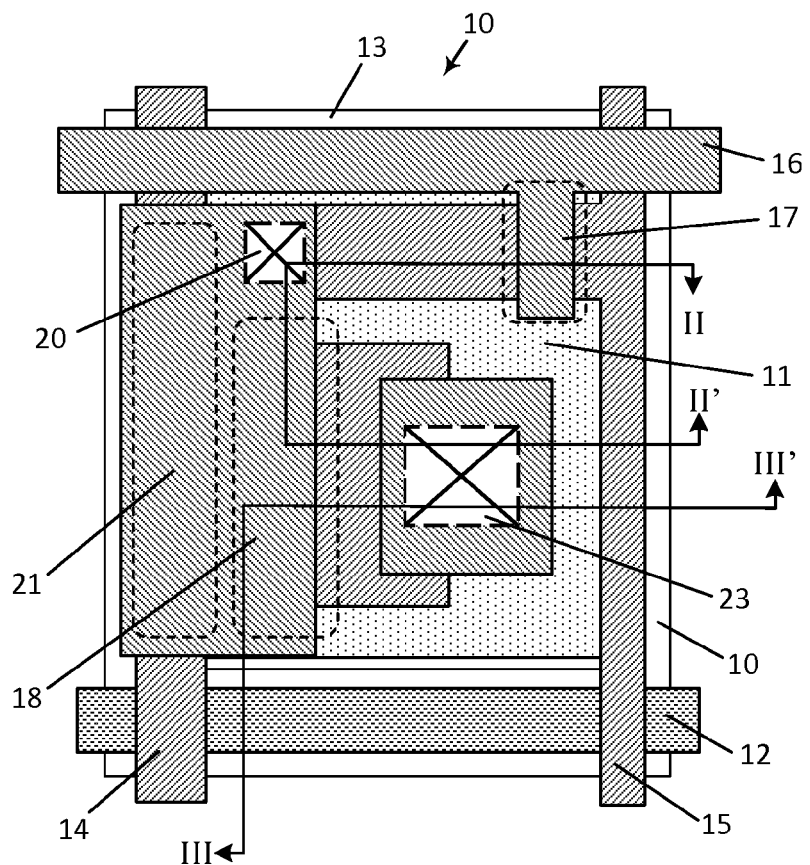
FIG. 4B shows the layout of a SWCNT control circuits according to embodiments of the invention.

FIG. 4B shows a layout of the SWCNT control circuits according to embodiments of the invention. As shown in FIG. 4B, the individual pixel 10 includes a P-electrode 11 and an N-electrode connected with other N-electrodes to for an N-common source line 12 for an LED 13. A Vdd line 14 and a data line 15 at the sides of an individual pixel 10 cross the N-common source line 12 at one end of the individual pixel 10. A scan line 16 crossing the Vdd line 14 and the data line 15 at the other end of the individual pixel 10. A single-walled carbon nanotubes switching transistor 17 directly connected to the Scan line 16 and the data line 15. The single-walled carbon nanotubes switching transistor 17 is connected to the single-walled carbon nanotubes driving transistor 18 by an upper Via electrode 20. The single-walled carbon nanotubes driving transistor 18 is connected to a charge storage capacitor 21 over the Vdd line 14. The P-electrode 11 is directly connected to the single-walled carbon nanotubes driving transistor 18 by a lower Via electrode 23.

Figure 4C:
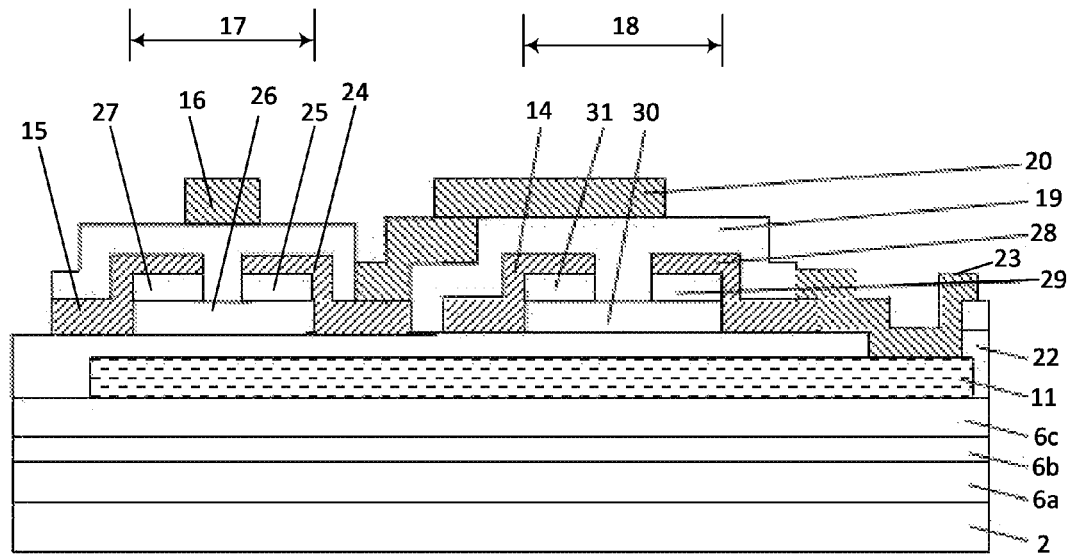
FIG. 4C is a cross-sectional view along line II-II of the SWCNT control circuits shown in FIG. 4B according to embodiments of the invention.
Figure 4D:
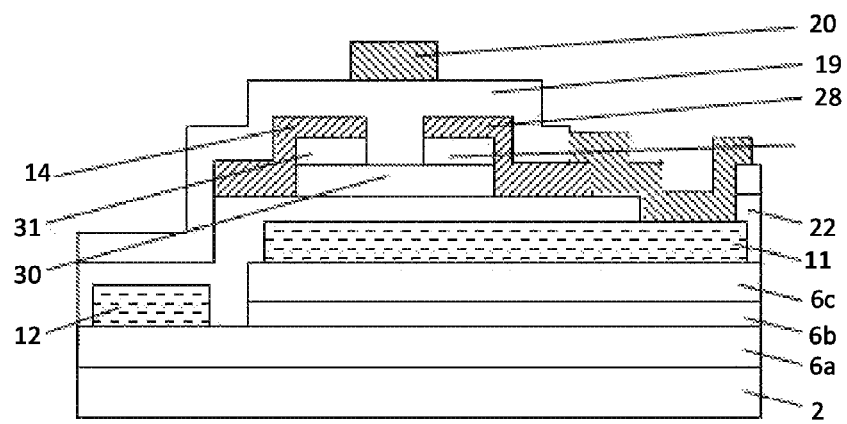
FIG. 4D is a cross-sectional view along line III-III of the SWCNT control circuits shown in FIG. 4B according to embodiments of the invention.

FIG. 4C is a cross-sectional view along line II-II of the SWCNT control circuits shown in FIG. 4B according to embodiments of the invention. FIG. 4D is a cross-sectional view along line III-III of the SWCNT control circuits shown in FIG. 4B according to embodiments of the invention. As shown in FIG. 4C, a drain electrode 24 of the single-walled carbon nanotubes switching transistor 17 is connected to the upper Via electrode 20, which is the gate electrode of the single-walled carbon nanotubes driving transistor 18, through an upper dielectric layer 19. The drain electrode 24 of the single-walled carbon nanotubes switching transistor 17 is directly connected to a drain contact 25 of the single-walled carbon nanotubes switching transistor 17. The drain contact 25 is on the single-walled carbon nanotubes active layer 26 of the single-walled carbon nanotubes switching transistor 17 opposite and separated from the source contact 27 of the single-walled carbon nanotubes switching transistor 17.

As shown in FIGS. 4C and 4D, the P-electrode 11 is connected to the lower Via electrode 23 of the single-walled carbon nanotubes driving transistor 18 through a lower dielectric layer 22. More specifically, the lower Via electrode 23 is directly connected to the drain electrode 28 of the single-walled carbon nanotubes driving transistor 18 and the drain electrode 28 of the single-walled carbon nanotubes driving transistor 18 is directly connected to the drain contact 29 of the single-walled carbon nanotubes driving transistor 18. The drain contact 29 is on the single-walled carbon nanotubes active layer 30 of the single-walled carbon nanotubes driving transistor 18 opposite and separated from the source contact 31 of the single-walled carbon nanotubes driving transistor 18.

Figure 5:
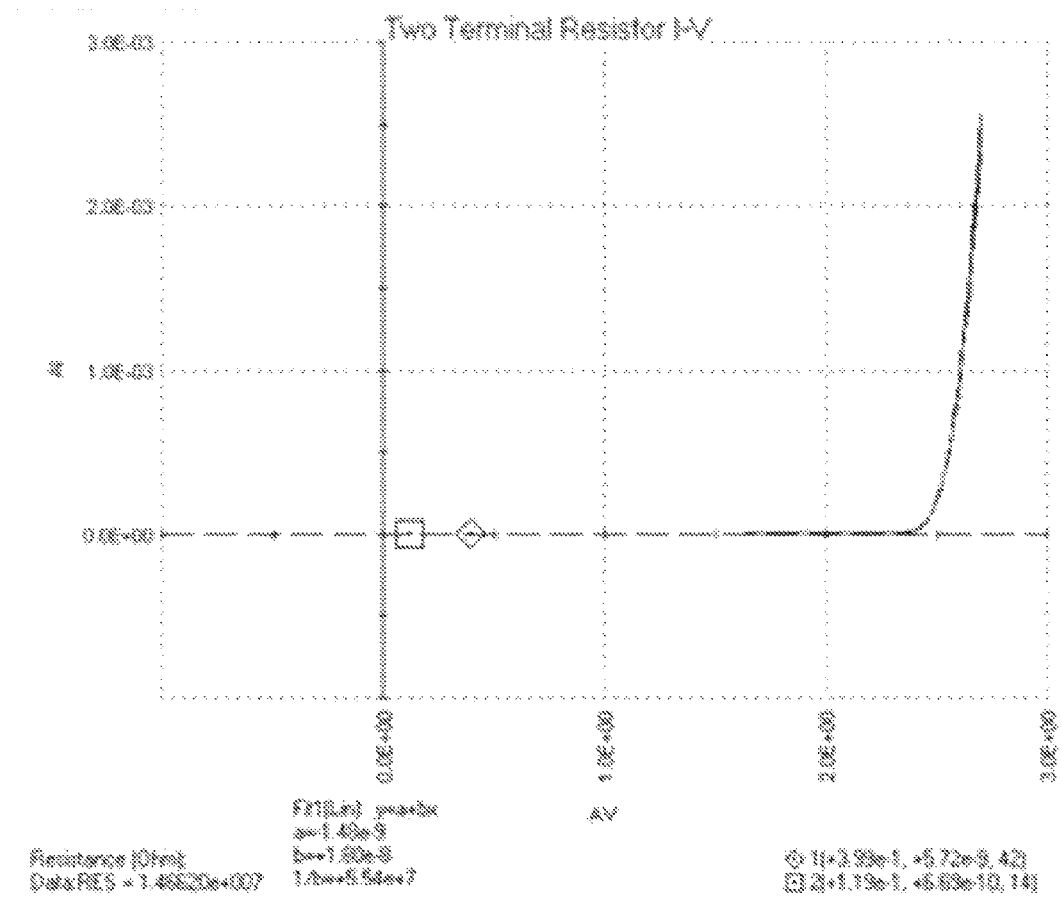
FIG. 5 shows an I-V curve of single pixel as characterized by a Keithley 4200 semiconductor characterization system according to embodiments of the invention.

FIG. 5 shows an I-V curve of single pixel according to embodiments of the invention. The I-V curve of single pixel was characterized with a Keithley 4200 semiconductor characterization system, as shown in FIG. 5. Upon application of an increasing voltage, the pixel lights up at 2.3 V and current flow increases as the voltage increases. The brightness of a single pixel is greater than 30,000 lumens, above the detector limit, when a 9 V battery is used together with SWCNT control circuits.

In some embodiments, the single-walled carbon nanotubes can be semiconducting single-walled carbon nanotubes. Such semiconducting single-walled carbon nanotubes can be high purity, single chirality single-walled carbon nanotubes with indexes of 64, 91, 83, 65, 73, 75, 102, 84, 76, and 92 extracted from a High Pressure CO Pressure (HiPCO) single-walled carbon nanotubes. Additionally in some embodiments, the high purity, single chirality single-walled carbon nanotubes can be 65 single-walled carbon nanotubes transistors (65 SWCNT). The single chirality 65 single-walled carbon nanotubes can be extracted from HiPCO single-walled carbon nanotubes. An AMLED according to embodiments of the invention can include the LED pixels, described above, with single chirality 65 single walled carbon nanotubes (65 SWCNT) control circuits so as to form active an matrix LED display module with a resolution of 120×90.

Figure 6:
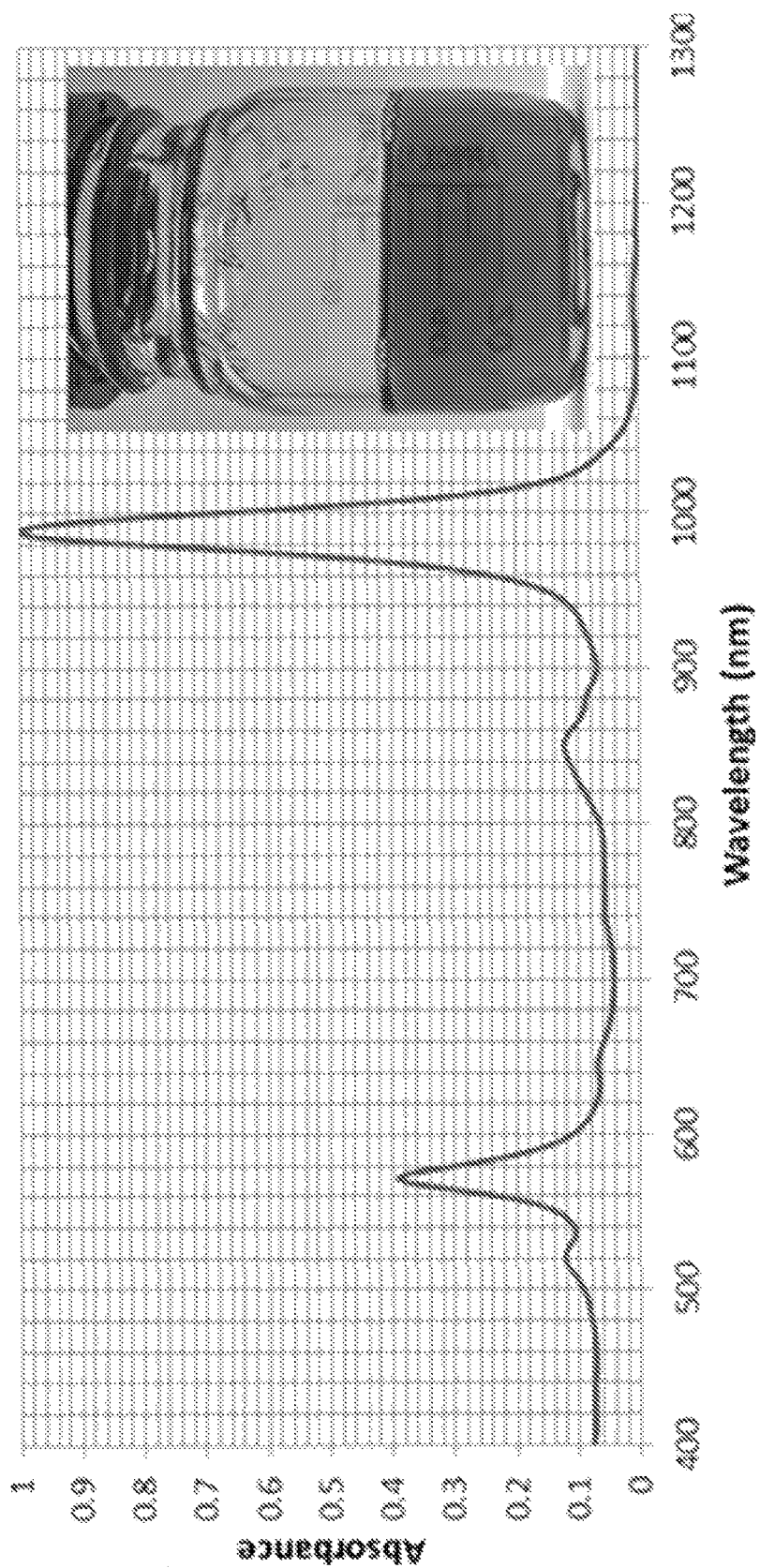
FIG. 6 shows a normalized vis-NIR absorption spectrum of 65 SWCNT solution with an insert showing a Vial of 65 SWCNT solution according to embodiments of the invention.

In some embodiments, the single chirality 65 SWCNT solution is extracted from a High Pressure CO combustion (HiPCO) raw powder single-walled carbon nanotubes in accordance with the PCT Application No. WO2000/017102. The method of producing the HiPCO SWCNT raw materials can be easily scaled up to a kilogram daily. In some embodiments, the concentration of 65 SWCNT solution is around 0.01 mg/mL and the spectral purity is greater than 95%, showing dominant absorbances peaked at 978 nm (E11) and 562 nm (E22). FIG. 6 shows a normalized vis-NIR absorption spectrum of 65 SWCNT solution with an insert showing a Vial of 65 SWCNT solution according to embodiments of the invention.

Figure 7:
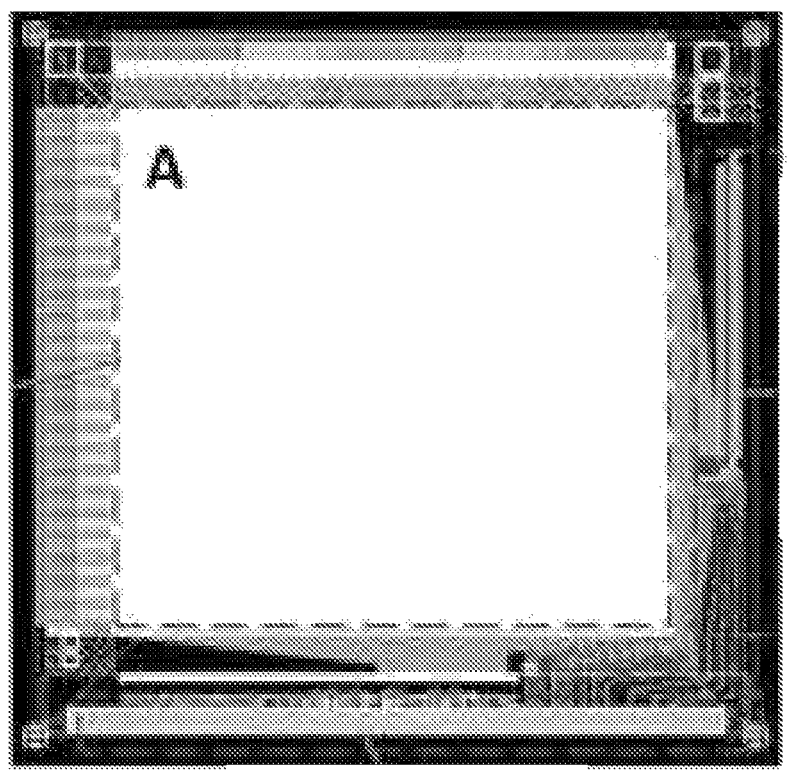
FIG. 7 shows an illustration of the AMLED display module with 65 SWCNT control circuits produced after 8 step processes using six photomasks according to embodiments of the invention.
Figure 8A:
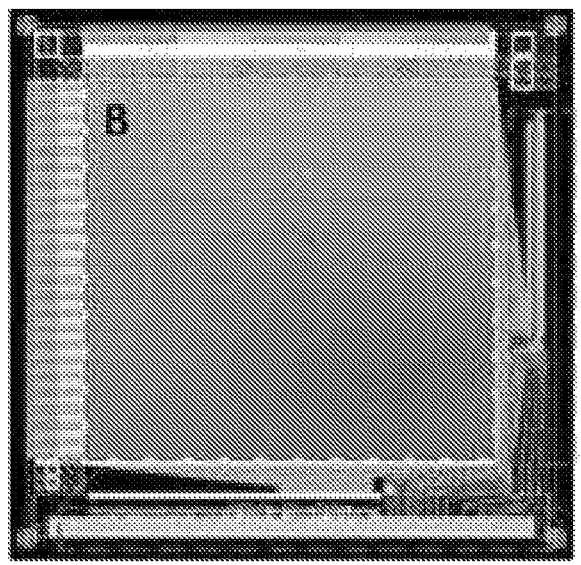
FIGS. 8A-8E are illustrations of the AMLED display module corresponding to the applied voltage of 2.5 V to 2.7 V, 3.0 V, 3.5 V and 4.0 V, respectively, according to embodiments of the invention.
Figure 8B:
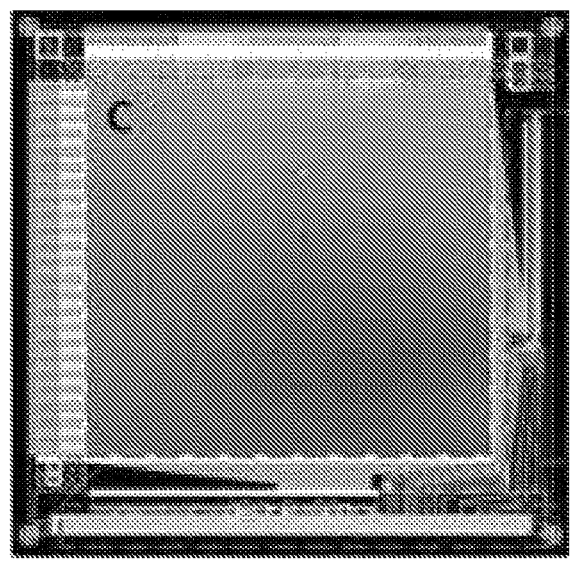
Figure 8C:
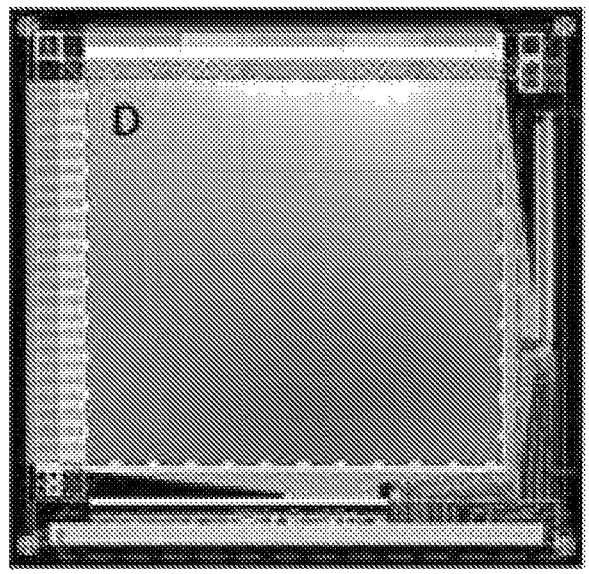
Figure 8D:
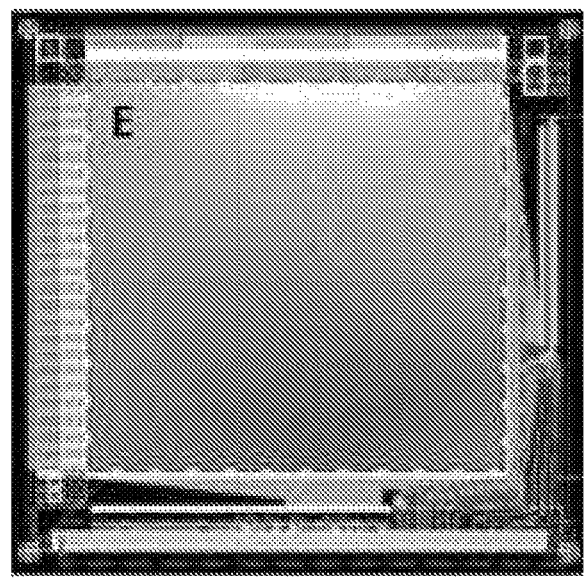
Figure 8E:
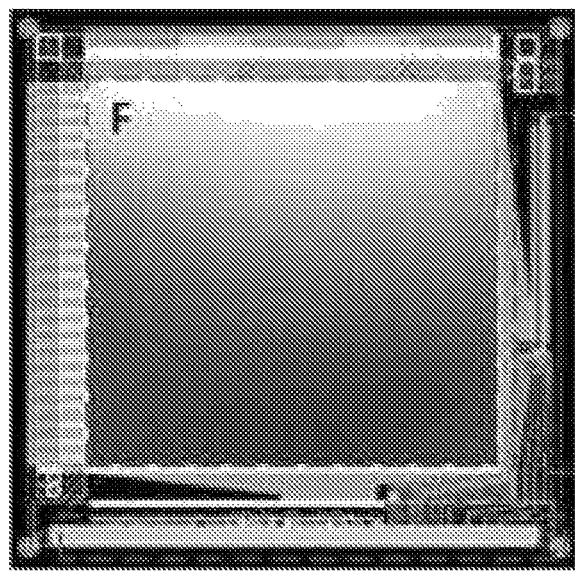

FIG. 7 shows an illustration of the AMLED display module with 65 SWCNT control circuits produced after 8 step processes using six photomasks according to embodiments of the invention. Generally, N-electrodes of LED pixels are electrically connected with nickel/gold to form N-COM source lines (thickness: 140 nm/10 nm) using photolithography and lift-off. Then a first insulation layer of $SiO_2$ (thickness: 100-300 nm) is deposited to isolate the layer of N-COM source lines from the SWCNT control circuits. Following the SWCNT film deposition, using either amine assisted solution coating or aerosol jet printing, 10 nm gold source/drain contacts are patterned using photolithography and lift-off. The source/drain contacts can be used for subsequent alignment in defining the active SWCNT layers. Active SWCNT layers are defined using photolithography and the developed areas being etched by $O_2$ plasma at 100 W/150 mTorr for 75 seconds. On top of the source/drain contacts, chromium/gold source/drain layers (thickness: 240 nm/10 nm) including source/drain electrodes, data lines and Vdd lines were patterned using photolithography and lift-off. Then, a second insulation layer of $SiO_2$ (thickness: 150 nm) is deposited for use as gate dielectrics. For interlayer connections, VIA holes (5 μm$^2$ for transistor-transistor connection, 10 μm$^2$ for transistor-OLED connection) are formed using photolithography and dry etch. A chromium/gold (thickness: 290 nm/10 nm) gate layer for gate electrodes, gate lines and interconnection lines is patterned using photolithography and lift-off.

In embodiments of the invention, an AMLED display module integrated with single-walled carbon nanotubes control circuits includes, lights up the light emitting diode pixels when an applied voltage is greater than 2.5 V and can produce a brightness greater than 15,000 Cd when an applied voltage is greater than 4.0 V. An AMLED display module can have pixels at different voltages to have pixels with different brightness levels or all of the pixels can receive the same voltage to be at the same brightness level to check the consistency of all the pixels in an AMLED display module. FIGS. 8A-8E are illustrations of the AMLED display module corresponding to the applied voltage of 2.5 V to 2.7 V, 3.0 V, 3.5 V and 4.0 V, respectively, according to embodiments of the invention.

FIGS. 9A-9I are illustrations of steps of a method to form active matrix single-walled carbon nanotubes control circuits integrated on LED pixels according to embodiments of the invention. As shown in FIGS. 9A-9I, a method to form active matrix single-walled carbon nanotubes control circuits integrated on LED pixels, can include the steps of:
  (a) forming N-COM source line on the LED wafer;
  (b) forming a first insulation layer over the N-COM source line;
  (c) forming single-walled carbon nanotubes thin film on the first insulation layer;
  (d) forming source/drain contacts marks on the single-walled carbon nanotubes thin film;
  (e) patterning the single-walled carbon nanotubes thin film into active single-walled carbon nanotubes active layers;
  (f) forming source/drain electrodes over active single-walled carbon nanotubes layers;
  (g) forming a second insulation layer as a dielectric layer over the source/drain electrodes;
  (h) patterning Via holes in the dielectric layer;
  (i) forming gate electrodes and Via electrodes over dielectric layer.

In embodiments of the invention, fabrication of SWCNT control circuits can be designed with a 6 photomask process. An exemplary 6 photomask process flow is shown in Table 1 below.

TABLE 1

| Step | Process | Notes |
|---|---|---|
| 1. N-COM | Clean Sapphire substrate | |
| | PR(Nega.) + litho. + Develop | 1$^{st}$ PHOTOMASK |

TABLE 1-continued

| Step | Process | Notes |
|---|---|---|
| | Metal deposition | Adhere to $SiO_2$ (Ni/Au (top) >1500 Å) |
| | Lift off | |
| 2. Insulation layer | Clean & Deposit SiO2 layer | PECVD, 1500 Å |
| 3. Active layer | Clean | |
| | 65 SWCNT film | 10 nm-20 nm |
| 4. SD Mark | PR (NEG.) + litho. + develop | 2$^{nd}$ PHOTOMASK |
| | Metal deposition | Au = 100 Å-1000 Å (ohm contact) |
| | Lift off | |
| 5. Active island | Clean | |
| | PR(Positive) + litho. + develop | 3$^{rd}$ PHOTOMASK |
| | $O_2$ plasma etch | |
| 6. SD layer | Clean | |
| | PR(NEG.) + litho. + develop | 4$^{th}$ PHOTOMASK |
| | Metal deposition | Cr/Au(Top) = 2400 Å/100 Å |
| | Lift off | |
| 7. Dielectric layer | Clean & Deposit $SiO_2$ layer | PECVD, 1500 Å |
| 8. VIA hole | PR(POS.) + litho. + develop | 5$^{th}$ PHOTOMASK |
| | Dry etch | |
| 9. Gate layer + VIA Contact | Clean | |
| | PR(NEG.) + litho. + develop | 6$^{th}$ PHOTOMASK |
| | Metal deposition | Cr/Au (Top) = 2900 Å/100 Å |
| | Lift off | |

Figure 9A:
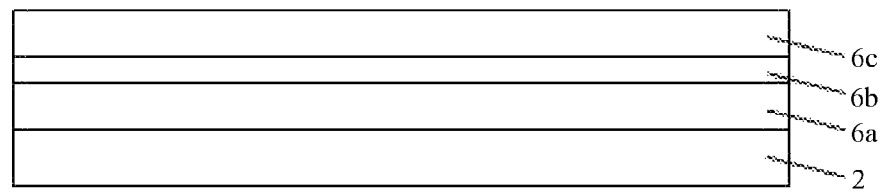
FIGS. 9A-9I are illustrations of steps of a method to form active matrix single-walled carbon nanotubes control circuits integrated on LED pixels according to embodiments of the invention.
Figure 9B:
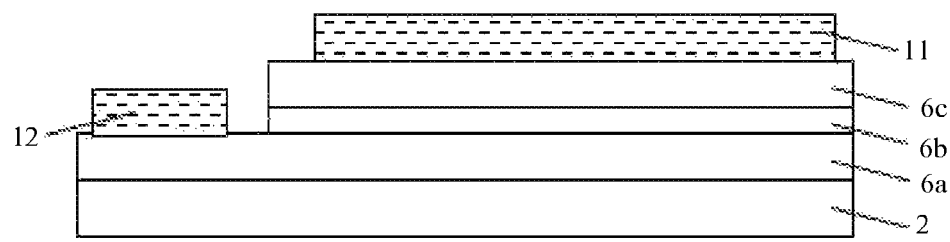

As shown in FIG. 9A, the LED 6 is a stack of semiconductor layers 6a, 6b and 6c on an LED wafer 2. In step 1, the method of forming N-electrode 12 and individual P-electrodes 11 in a pixel electrode layer can include, spin coating a photoresist layer on an LED wafer; photolithographically defining a pattern; solution developing the defined pattern; sputtering or evaporatively depositing Ni/Au on the photoresist layer; and lifting-off undefined photoresist. For the purpose of adhesion, an adhesion promoter can be spin coated on before the negative photoresist (benzocyclobutene, BCB) is spin coated on LED wafer 2. The photoresist layer is baked at 250° C. to form a 2 μm film. Using the first photomask, the pattern for the N-electrode and the P-electrode are photolithographed and developed. A double layer of nickel/gold having a thickness greater than 150 nm is deposited. In embodiments of the invention, forming the N-electrode and P-electrode can include depositing nickel/gold with a thickness of 300~500 nm and line width of 100 nm-20 μm. Nickel has better adhesion to an insulation layer and acts as a major conductor. Gold has high work function and better stability as a protection layer. After the photolithographed area is lifted off, a P-electrode is formed along with an N-electrode 12 that is formed to have a line width of about 10 μm, as shown in FIG. 9B. In some embodiments, the N-electrodes 12 of each pixel are connected to form a common source line (N-COM) using photolithography. This step can be used to ensure each N-electrode of each pixel in a module be electrically coupled together.

Figure 9C:
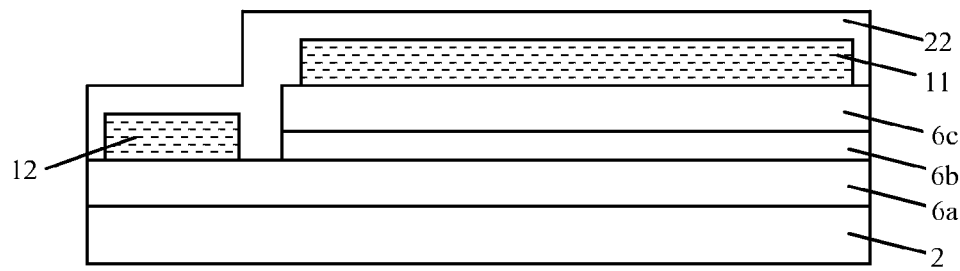

In step 2, a first insulation layer 22 can be deposited, as shown in FIG. 9C, over the pixel electrode layer containing the N-electrode 12 and the P-electrode 11. The insulation layer 22 can include either $SiO_2$ or $Si_3N_4$ with a thickness of 300 nm~500 nm. For example, a 300 nm thick insulation layer is deposited over the N-electrode 12, the P-electrode and the LED 6 to separate the SWCNT control circuits from the N-electrode 12 and the P-electrode 11. The insulation layer 22 of either silicon oxide ($SiO_x$) or silicon nitride ($Si_3N_4$) may be formed by plasma chemical vapor deposition (PECVD) or low pressure chemical vapor deposition (LPCVD). The low-κ insulating value of the insulation layer 22 is dependent on the flow rate of reactive gas such as oxygen ($O_2$) and ammonia ($NH_3$), and deposition electric power. In some embodiments, forming the insulation layer 22 over both the N-electrode 12 and the P-electrode 11 includes, depositing $SiO_2$ or $Si_3N_4$ using PECVD or LPCVD.

Figure 9D:
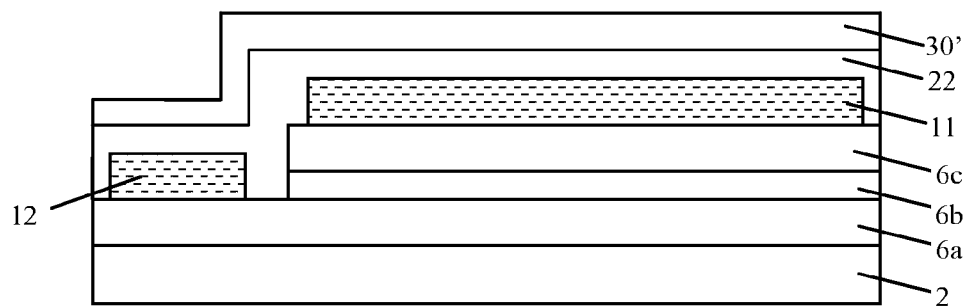

In step 3, a SWCNT thin film 30' is deposited on top of the first insulation layer 22 formed in step 2, as shown in FIG. 9D. The single-walled carbon nanotubes thin film 30' can include 65 single-walled carbon nanotubes in a layer with a thickness of 10 nm-20 nm. Methods of forming a 65 single-walled carbon nanotubes thin film 30' can include: printing 65 single-walled carbon nanotubes over insulation layer; and treating 65 single-walled carbon nanotubes with acetic acid vapor. The printing can be screen printing, inkjet printing, aerosol jet printing, roll-to-roll gravure, and flexography. Other methods of printing known to one skilled in the art are also envisaged for use in printing the SWCNT thin film 30'.

Figure 10B:
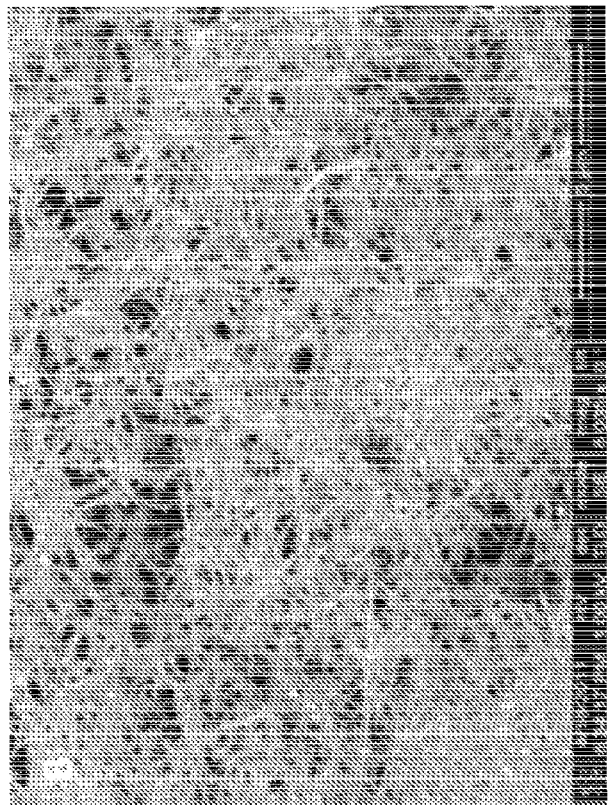
FIG. 10B shows a scanning electron microscope (SEM) image of a 65 SWCNT thin film by an aerosol jet printing method according to embodiments of the invention.
Figure 10A:
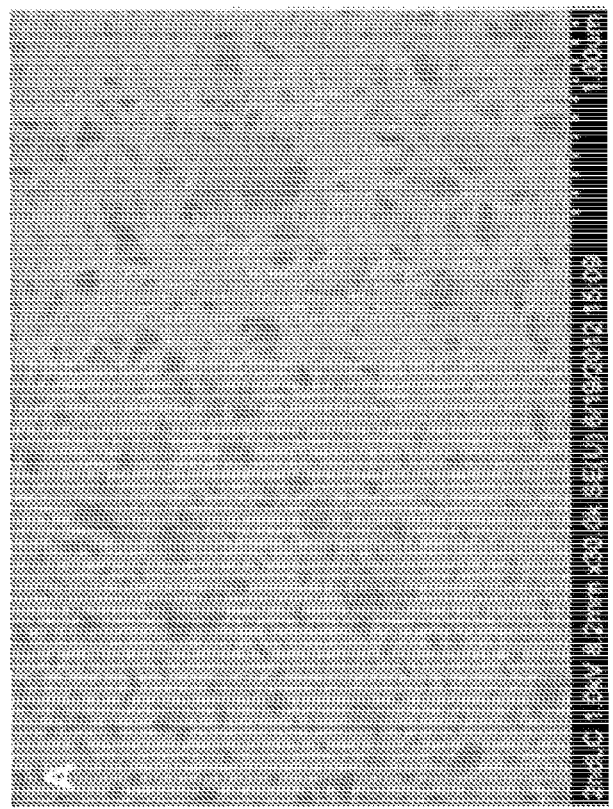
FIG. 10A shows a scanning electron microscope (SEM) image of a 65 SWCNT thin film made by an amine assisted solution coating method according to embodiments of the invention.

In one embodiment, formation of a 65 SWCNT thin film 30' can be achieved by using an amine-assisted solution coating. The process of forming single-walled carbon nanotubes layer using the amine-assisted solution coating method includes; solution depositing polyamines over insulation layer; solution depositing 65 single-walled carbon nanotubes over polyamines. For example, the polyamines are poly-L-lysine aqueous solution, such as poly-L-lysine (0.1% wt in water) and is used to cover the entire LED wafer. The LED wafer is left under the poly-L-lysine (0.1% wt in water) for 6 minutes. After the poly-L-lysine is removed and thee LED wafer is carefully cleaned using de-ionized water. The resulting amine covered surface is directly covered with high pure single chirality 65 SWCNT purple solution (>95%, extracted from HiPCO SWCNT raw powder). After 10 minutes, 65 SWCNT solution is recovered and the surface of LED wafer is extensively cleaned with de-ionized water. FIG. 10A shows a scanning electron microscope (SEM) image of a 65 SWCNT thin film made by an amine assisted solution coating method according to embodiments of the invention.

In another embodiment, the formation of 65 SWCNT thin film 30' can be achieved by aerosol jet printing. For example, high purity, single chirality 65 SWCNT purple solution (>95%, extracted from HiPCO SWCNT raw powder) is atomized to aerosol of droplets. The aerosol droplets can have a diameter in a range of 1 μm-5 μm. Such embodiments include aerosol produced by using ultrasonic atomizer at voltage range from 20 V-48 V or by pneumatic atomizer at 50-300 cubic centimeters per minute. The generated aerosol can be brought through a nozzle by high pure nitrogen or argon and focused onto deposit area by a sheath gas flow (high pure nitrogen or argon). For large area film deposition, a larger diameter nozzle is used. In some embodiments, the diameter of the nozzle is around 300 μm, or less than 500 μm, or less than 800 μm, or less than 1000 μm, or less than 5000 μm or less than 1 cm. The aerosol jet printed 65 SWCNT thin film is visually a white powder due to high concentration of sodium dodecyl sulfate. However, a gentle treatment with acetic acid gas to form a transparent 65 SWCNT thin film over the LED wafer 2. The aerosol jet printing of the 65 SWCNT thin film is further cleaned with de-ionized water. FIG. 10B shows a scanning electron microscope (SEM) image of a 65 SWCNT thin films by an aerosol jet printing method according to embodiments of the invention.

Figure 9E:
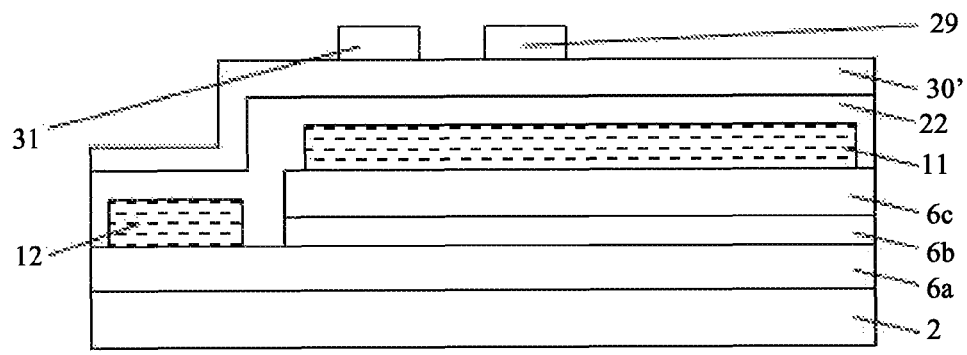

In step 4, a source contact 31 and drain contact 29 is formed on the 65 SWCNT thin film 30' corresponding to where a 65 SWCNT transistor will later be formed, as shown in FIG. 9E. Other source and drain contacts (not shown) are formed for another 65 SWCNT transistor (not shown) will be formed. In some embodiments, the method of forming source/drain contacts includes; spin coating a photoresist layer on the 65 SWCNT thin film; photolithographically defining a pattern; solution developing the defined pattern; sputtering or evaporatively depositing Au on the developed photoresist; and lifting-off the developed photoresist. In alternative embodiments, the procedures in forming source/drain contacts including negative photoresist coating, photolithographing with second photomask, developing, deposition and lift off are repeated to form source/drain contacts in the thickness range of 100-500 nm. In some embodiments, the lateral dimension of a source/drain contact is 58 μm in length and 10 μm in width for driving transistors, and 21 μm in length and 10 μm in width for switching transistors. The source/drain contacts are employed to act as alignment mask and also to prevent removal of 65 SWCNT thin film. The source/drain contacts can be gold with a thickness of 10-50 nm.

Figure 9F:
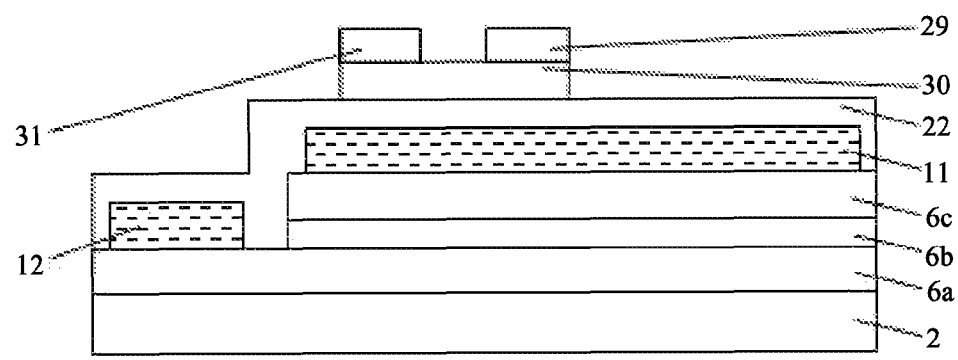

In step 5, the 65 SWCNT thin film is patterned into a 65 SWCNT active layer 30, as shown in FIG. 9F. In some embodiments, the method of patterning the 65 SWCNT thin film into a 65 SWCNT active layer 30 includes; spin coating a photoresist layer on the 65 SWCNT thin film; photolithographically defining the pattern; solution developing the defined pattern to form a developed photoresist; and $O_2$ plasma etching the 65 SWCNT thin film using the developed photoresist such that the 65 SWCNT thin film outside of where the thin film transistors are formed is etched out using $O_2$ plasma. In step 5, a positive photoresist can be spin-coated and then a third photomask is used to define the 65 SWCNT active layers using photolithography. The 65 SWCNT active layers are directly under and between the source/drain contacts. A transistor channel area is defined between the between the source/drain contacts. In some embodiments, the channel length is 10 μm for driving transistors and 7 μm for switching transistors. In some embodiments, the channel width is 58 μm for driving transistors and 21 μm for switching transistors.

Figure 9G:
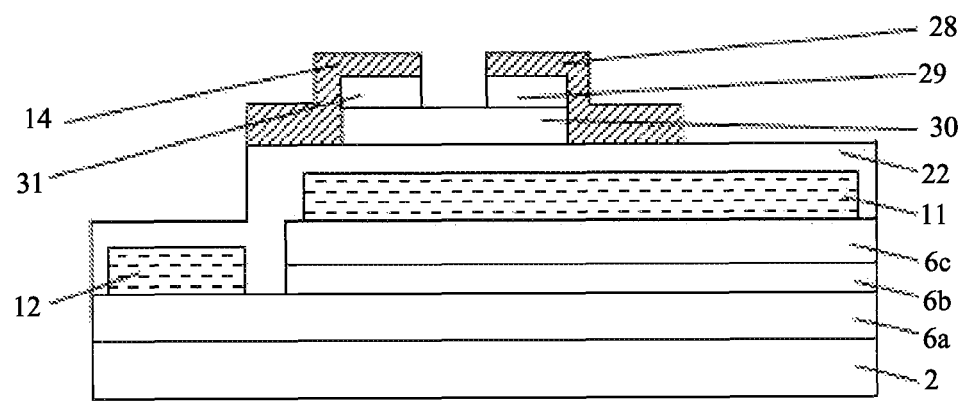

In step 6, a source electrode 14 and drain a electrode 28 are formed on the source contact 31 and the drain contact 29, respectively, as shown in FIG. 9G. In some embodiments, the method of forming the source and drain electrodes includes, spin coating a photoresist layer on single-walled carbon nanotubes layer; photolithographically defining a pattern; solution developing the defined pattern into a developed photoresist; sputtering or evaporatively depositing chromium/gold on the developed photoresist; and lifting-off developed photoresist. In some embodiments, the data line and Vdd line are also formed in addition to forming the source and drain electrodes. For example, step 6 can start with negative photoresist coating, which is followed by photolithographing using a fourth photomask, developing, metal deposition using sputtering or E-beam evaporation, lifting off the developed photoresist, similar to procedures in step 1 and step 4, to form the data line, Vdd line along with the source and drain electrodes.

In other embodiments, the deposited metal in step 6 is a double layer of chromium covered with gold. Chromium has better adhesion to the insulation layer and act as a major conductor. Gold has high work function and better stability as protection layer. In some embodiments, the thickness of chromium can range from 150 nm to 500 nm, and the thickness of gold can range from 10 nm to 100 nm. Additionally, the lateral dimension of the source and drain electrodes can be exactly same as that of the source and drain contacts. In other embodiments, the line width of data line and Vdd line can be 10 µm. The source and drain electrodes include chromium/gold and have a thickness in the range of 300~500 nm with a line width in the range of 100 nm~20 µm.

Figure 9H:
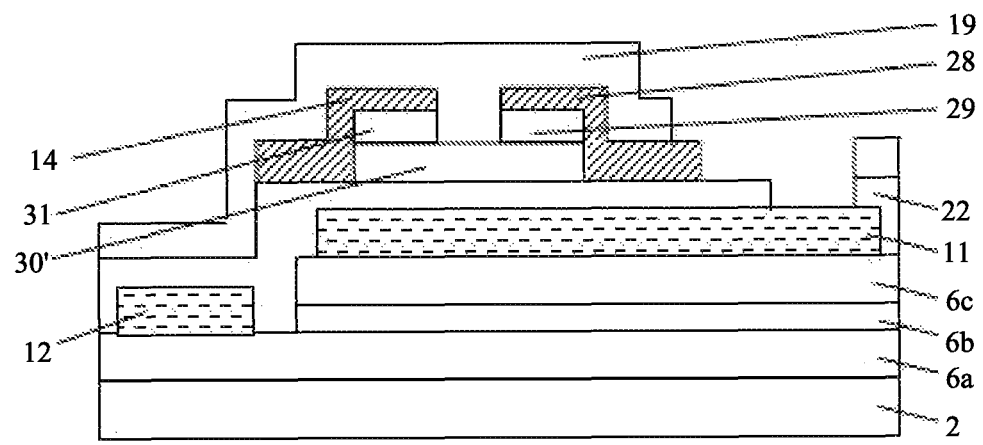

In step 7, Via holes are patterned, including a Via hole 31 through the first insulation layer 22 to the P-electrode 11, as shown in FIG. 9H. Further, a second insulation film or dielectric layer 19 is formed over the source electrode 14, drain electrode 28. In embodiments of the invention, the method of patterning Via holes in the first insulation layer 22 and the dielectric 19 can include; spin coating a photoresist layer on the first insulation layer and the dielectric layer; photolithographically defining a pattern; solution developing the defined pattern into a developed photoresist; and dry or wet etching the dielectric using the developed photoresist. The interconnections, from drain electrodes of switching transistors to gate electrodes of driving transistors and from drain electrodes of driving transistors to P-electrodes of LED pixels, are defined with photolithography by using a fifth photomask. For example, the deposited dielectric layer, a positive photoresist is spin-coated on and developed using the fifth photomask. After developing the photoresist, the Via holes in the deposited dielectric layer and the first insulation layer are formed by dry etch using the developed photoresist. The Via holes used to interconnect drain electrodes with gate electrodes of driving transistors can be 5 µm² squares, and the Via holes used to interconnect drain electrodes of driving transistors to P-electrodes of LED pixels can be 10 µm² squares.

In other embodiments, the Via holes in the dielectric layer can be formed separately from the Via holes in the first insulation layer by depositing the dielectric layer and then forming Via holes in the dielectric layer using dry etch techniques. Similar to step 2, the deposited dielectric layer can be silicon dioxide ($SiO_2$) or silicon nitride ($Si_3N_4$). The dielectric layer can be deposited using either plasma chemical vapor deposition (PECVD) or low pressure chemical vapor deposition (LPCVD). The thickness can range from 50 nm to 500 nm.

Figure 9I:
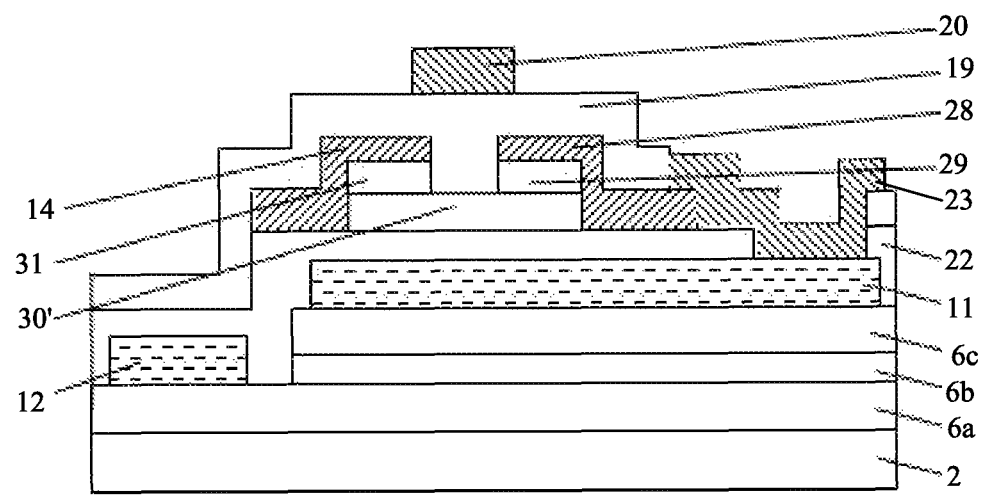

In step 8, in some embodiments, a gate layer 20 for the 65 SWCNT thin film 30 and a lower Via electrode 23 for connection to the P-electrode 11 are formed on the dielectric layer 19, as shown in FIG. 9I. The method of forming gate layer 20 and a lower Via electrode 23 includes; spin coating photoresist on the dielectric layer 19; photolithography defining a patterned photoresist; solution developing the defined pattern into a developed photoresist; sputtering or evaporatively depositing Cr/Au on the developed photoresist; and lifting-off the developed photoresist. Additionally, the dielectric 19 layer sandwiched between the Vdd line and the gate layer 20 forms a capacitor for charge storage.

The process of step 8 can include depositing gate electrode layer while simultaneously interconnecting drain electrodes of switching transistors to gate electrodes of driving transistors and interconnecting drain electrodes of driving transistors to P-electrodes of LED pixels through VIA holes formed in step 7. For example, similar to steps 1, 4 and 6, after negative photoresist is spin-coated, the gate electrodes, gate lines and interconnection lines can be defined by photolithography using sixth photomask. Following the developing, photolithographed areas are lifted off to form a gate layer. At the same time, VIA contacts to interconnect drain electrodes of switching transistors to gate electrodes of driving transistors, to interconnect drain electrodes of driving transistors to P electrodes of LED pixels are also formed.

In some embodiments, the gate layer and lower Via electrode can be made of a double layer of chromium covered with gold. The thickness of the chromium can range from 200 nm to 500 nm, and the thickness of gold can be in the range of 10 nm to 100 nm. The line width of gate electrodes, gate lines and interconnection lines can be 10 µm. Chromium has better adhesion to the dielectric layer and acts as major conductor. Gold has high work function and better stability as protection layer. In some of the above embodiments, the gate layer and lower Via electrode can include chromium/gold, which can have a thickness of 300~500 nm and a line width of 100 nm~20 µm.

The device and method has been described in detail with specific reference to these illustrated embodiments. It will be apparent, however, that various modifications and changes can be made within the spirit and scope of the disclosure as described in the foregoing specification, and such modifications and changes are to be considered equivalents and part of this disclosure.

What is claimed is:

1. A method of forming active matrix single-walled carbon nanotubes control circuits integrated on light-emitting diode pixels, comprising the steps of:
    forming an N-COM layer on an light-emitting diode wafer;
    forming an insulation layer over the N-COM layer;
    forming a single-walled carbon nanotubes thin film on the insulation layer;
    forming a plurality of source and drain contacts on the single-walled carbon nanotubes thin film;
    patterning an active single-walled carbon nanotubes thin film;
    forming source and drain electrodes over the active single-walled carbon nanotubes thin film;
    forming a dielectric layer over the source/drain layer;
    patterning a plurality of Via holes in the dielectric layer; and
    forming a gate layer and a Via electrode over the dielectric layer.

2. The method of claim 1, wherein the N-COM layer comprises nickel/gold and has a thickness of 300 nm-500 nm and line width in the range of 100 nm-20 µm.

3. The method of claim 2, wherein the forming the N-COM layer comprises:
    spin coating a photoresist layer on an LED wafer;
    defining a pattern by photolithography to generate regions of a defined photoresist;
    solution developing the defined pattern into a developed photoresist;
    depositing a Ni/Au layer on the developed photoresist by one of sputtering and evaporation; and lifting-off the developed photoresist.

4. The method of claim 1, wherein the insulation layer comprises one of $SiO_2$ and $Si_3N_4$ with a thickness of 300~500 nm.

5. The method of claim 4, wherein the forming the insulation layer comprises depositing $SiO_2$ or $Si_3N_4$ over the N-COM layer uses one of plasma chemical vapor deposition and low pressure chemical vapor deposition.

6. The method of claim 1, wherein the single-walled carbon nanotubes layer comprises 65 single-walled carbon nanotubes in a layer with a thickness of 10-20 nm.

7. The method of claim 6, wherein the forming the single-walled carbon nanotubes layer comprises:
   solution depositing polyamines over the insulation layer for 5 minutes to 24 hours; and
   solution depositing the 65 single-walled carbon nanotubes over the polyamines for 5 minutes to 24 hours.

8. The method of claim 7, wherein the polyamines comprises a poly-L-lysine aqueous solution.

9. The method of claim 6, wherein the forming the single-walled carbon nanotubes layer comprises:
   printing the 65 single-walled carbon nanotubes over the insulation layer; and
   treating the 65 single-walled carbon nanotubes with acetic acid vapor for 10 minutes to 24 hours.

10. The method of claim 9, wherein the 65 single-walled carbon nanotubes is selected from the group including screen printing, inkjet printing, aerosol jet printing, roll-to-roll gravure, and flexography.

11. The method of claim 1, wherein the plurality of source and drain contacts comprises gold with a thickness of 10 nm-50 nm.

12. The method of claim 11, wherein the forming the source and drain contacts further comprises:
   spin coating a photoresist layer on the single-walled carbon nanotubes layer;
   defining a pattern by photolithography to create regions of defined photoresist;
   solution developing the defined pattern to form a developed photoresist;
   depositing Au on the developed photoresist layer; and
   lifting-off the developed photoresist.

13. The method of claim 1, wherein the patterning the active single-walled carbon nanotubes thin film further comprises:
   spin coating a photoresist on the single-walled carbon nanotubes thin film;
   defining a pattern by photolithography to create regions of a defined photoresist and undefined photoresist;
   solution developing the defined pattern to form a developed photoresist; and
   plasma etching the single-walled carbon nanotubes thin film using the developed photoresist.

14. The method of claim 1, wherein the source and drain electrodes comprise chromium/gold and has a thickness of 300 nm~500 nm and line width of 100 nm~20 μm.

15. The method of claim 14, wherein the forming the source and drain electrodes further comprises:
   spin coating a photoresist layer on the single-walled carbon nanotubes layer;
   defining a pattern by photolithography to create regions of defined photoresist and undefined photoresist;
   solution developing the defined pattern to form a developed photoresist;
   depositing chromium/gold on the developed photoresist layer by one of sputtering and evaporation; and
   lifting-off the developed photoresist.

16. The method of claim 1, wherein the dielectric layer comprises $SiO_2$ or $Si_3N_4$ and has a thickness in the range of 50 nm-500 nm.

17. The method of claim 16, wherein the dielectric layer is formed by depositing $SiO_2$ or $Si_3N_4$ over the source and drain electrodes using plasma chemical vapor deposition or low pressure chemical vapor deposition.

18. The method of claim 1, wherein the patterning Via holes comprises:
   spin coating a photoresist on the dielectric layer;
   defining a pattern by photolithography to create regions of a defined photoresist;
   solution developing the defined pattern to form a developed photoresist; and
   dry or wet etching the developed dielectrics using the developed photoresist.

19. The method of claim 1, wherein the gate layer and the Via contact comprises chromium/gold and has a thickness of 300 nm~500 nm and line width of 100 nm~20 μm.

20. The method of claim 19, wherein the forming gate layer and Via contact comprises:
   spin coating a photoresist layer on the dielectric layer;
   defining a pattern by photolithography to create regions of a defined photoresist and undefined photoresist;
   developing the defined photoresist pattern;
   depositing Cr/Au on the developed photoresist layer by one of sputtering and evaporation; and
   lifting-off the developed photoresist.

* * * * *